(12) United States Patent
Iida (10) Patent No.: US 8,687,440 B2
(45) Date of Patent: Apr. 1, 2014

(54) SEMICONDUCTOR MEMORY DEVICE (75) Inventor: Masahisa Iida, Osaka (JP)

(73) Assignee: Panasonic Corporation, Osaka (JP)

( * ) Notice: Subject to any disclaimer, the term of this patent is extended or adjusted under 35 U.S.C. 154(b) by 15 days.

(21) Appl. No.: 13/457,042

(22) Filed: Apr. 26, 2012

(65) Prior Publication Data

US 2012/0213016 A1 Aug. 23, 2012

Related U.S. Application Data

(63) Continuation of application No. PCT/JP2010/006501, filed on Nov. 4, 2010.

(30) Foreign Application Priority Data

Dec. 3, 2009 (JP) .................................. 2009-275649

(51) Int. Cl.
*G11C 7/06* (2006.01)
(52) U.S. Cl.
USPC ......................................................... 365/191
(58) Field of Classification Search
None
See application file for complete search history.

(56) References Cited

U.S. PATENT DOCUMENTS

| | | |
|---|---|---|
| 4,703,453 A | 10/1987 | Shinoda et al. |
| 4,817,052 A | 3/1989 | Shinoda et al. |
| 4,943,967 A | 7/1990 | Shinoda et al. |
| 5,177,743 A | 1/1993 | Shinoda et al. |
| 5,515,325 A | 5/1996 | Wada |
| 5,752,270 A | 5/1998 | Wada |
| 6,026,048 A | 2/2000 | Wada |
| 6,327,188 B1 | 12/2001 | Wada |
| 6,337,809 B1 | 1/2002 | Kim et al. |
| 6,678,860 B1 | 1/2004 | Lee |
| 7,051,264 B2 | 5/2006 | Leung et al. |
| 2002/0012276 A1 | 1/2002 | Wada |
| 2002/0184592 A1 | 12/2002 | Koga et al. |
| 2003/0008446 A1 | 1/2003 | Osada et al. |
| 2005/0005230 A1 | 1/2005 | Koga et al. |
| 2005/0174833 A1 | 8/2005 | Hirabayashi |
| 2006/0112321 A1 | 5/2006 | Leung |
| 2006/0200728 A1 | 9/2006 | Nagai et al. |
| 2007/0226590 A1 | 9/2007 | Nagai |
| 2007/0286001 A1 | 12/2007 | Osada et al. |
| 2009/0094493 A1* | 4/2009 | Iida ............................ 714/718 |

FOREIGN PATENT DOCUMENTS

| | | |
|---|---|---|
| JP | 52-129334 | 10/1977 |
| JP | 55-093598 | 7/1980 |
| JP | 58-139399 | 8/1983 |
| JP | 59-218556 | 12/1984 |

(Continued)

OTHER PUBLICATIONS

International Search Report issued in International Patent Application No. PCT/JP2010/006501, mailed Feb. 8, 2011.

*Primary Examiner* — Hoai V Ho
*Assistant Examiner* — James G Norman
(74) *Attorney, Agent, or Firm* — McDermott Will & Emery LLP (57) ABSTRACT

At a succeeding stage of a sense amplifier, a first data latch is provided which has the same bit number as the page length and is controlled to invariably hold the same data as that of the sense amplifier. When a column address strobe (CAS) access begins, data is transferred from the first data latch to an error checking and correcting circuit, and error correction and parity generation are performed in a pipeline process. As a result, the CAS access time and the CAS cycle time are reduced.

18 Claims, 5 Drawing Sheets

(56) References Cited

FOREIGN PATENT DOCUMENTS

| | | |
|---|---|---|
| JP | 60-253100 | 12/1985 |
| JP | 02-143557 | 6/1990 |
| JP | 7-182870 | 7/1995 |
| JP | 11-066864 | 3/1999 |
| JP | 11-283374 | 10/1999 |
| JP | 2000-339964 | 12/2000 |
| JP | 2001-084792 | 3/2001 |
| JP | 2003-059290 | 2/2003 |
| JP | 2005-025827 | 1/2005 |
| JP | 2005-222618 | 8/2005 |
| JP | 2006-244632 | 9/2006 |
| JP | 2007-242162 | 9/2007 |
| JP | 2009-093704 | 4/2009 |
| JP | 4293380 | 7/2009 |

* cited by examiner

SEMICONDUCTOR MEMORY DEVICE

CROSS-REFERENCE TO RELATED APPLICATIONS

This is a continuation of PCT International Application PCT/JP2010/006501 filed on Nov. 4, 2010, which claims priority to Japanese Patent Application No. 2009-275649 filed on Dec. 3, 2009. The disclosures of these applications including the specifications, the drawings, and the claims are hereby incorporated by reference in their entirety.

BACKGROUND

The present disclosure relates to semiconductor memory devices including an error checking and correcting (ECC) circuit.

In recent years, there has been a demand for embedded dynamic random access memory (DRAM) devices having higher integration density in order to achieve a low-cost system on chip (SOC). Most of the memory area is occupied by the memory array portion. In order to achieve a higher integration density, the area of a memory cell itself has been reduced by applying microfabrication technology to memory cell transistors, or memory capacitors including high-k insulating film.

In the case of a stacked memory cell, although the capacitor surface area decreases with decreasing memory cell area, a desired capacitor capacity is ensured by introducing an additional high-k insulating film. However, in order to increase the capacitor capacitance, the insulating film needs to be thinned to an extremely small thickness, resulting in an increase in tunnel leakage current in the capacitor insulating film. Moreover, because logic compatibility is strongly required in the microfabrication process, storage nodes are silicided. However, this causes an increase in junction leakage at the storage node. Therefore, the charge retention time of the cell disadvantageously decreases. It is also necessary to address a degradation in reliability of the charge retention time, the cell access time, etc. which is caused by changes over time of the characteristics of a cell capacitor or a transistor after manufacture. It is known that the ECC technique is useful for reducing or preventing the degradation in charge retention characteristics and reliability of a cell.

United States Patent Publication No. 2006/0112321 (Patent Document 1) describes a semiconductor memory device including an ECC circuit. In particular, this document describes a sequence technique for performing error correction operation having a byte write function. Specifically, word lines and sense amplifiers are continuously activated in a series of sequences in which error-corrected read data, replacement data obtained by replacing a portion of the data with external data, and parity data generated from the replacement data, are written back to memory cells.

Japanese Patent Publication No. 2003-59290 (Patent Document 2) describes a configuration for performing error correction operation having a byte write function. Specifically, a portion (m bits) of n-bit error correction read data is replaced with external input data, and the resulting data is written back, where n and m are natural numbers which satisfy n>m.

Japanese Patent Publication No. 2005-25827 (Patent Document 3) describes a synchronous DRAM (SDRAM) device in which read/modify/write operation is performed in order to achieve ECC operation having a byte mask function. Specifically, syndrome generation and error correction are completed during read latency. When write operation is performed, error-corrected read data is previously prepared during read latency, and parity generation and write back operation are executed during each burst cycle after the read latency has elapsed, whereby burst data input can be interrupted.

Japanese Patent Publication No. 2006-244632 (Patent Document 4) describes an SDRAM device in which pipeline read/modify/write operation is performed in order to achieve ECC operation having a byte mask function. In order to reduce or prevent bus collision during read operation preceding write operation and during write back operation of write data and parity data, DQ lines for read operation and DQ lines for write operation are separately provided, or read operation and write operation are separately performed during even-numbered and odd-numbered cycles of burst operation.

When stored data is read in these semiconductor memory devices, initially, signals of a plurality of bits corresponding to a row address are read from the memory cell array, and are amplified and held by sense amplifiers (row address strobe (RAS) cycle). Thereafter, at column gates, signals of a portion of the plurality of bits selected based on a column address are input via a buffer to an ECC circuit and are subjected to error checking and correcting, and the resulting data is output as read data from the semiconductor memory device (column address strobe (CAS) cycle).

Japanese Patent Publication No. 2009-93704 (Patent Document 5) describes a technique of reducing a CAS access time during random and page operations in an embedded DRAM device having a byte mask function. Specifically, during a RAS access time period, memory cell data is transferred, amplified, and held in a read amplifier, and during page write operation, write data is simultaneously written to a memory cell and a read amplifier which also serves as a data latch.

U.S. Pat. No. 7,051,264 (Patent Document 6) describes a technique of increasing a clock cycle rate. Specifically, in a semiconductor memory device in which write data latency is required, but one random cycle ECC operation is completed during one clock, write operation is performed in a two-stage pipeline process including the first stage in which parity generation and latching in a register are performed and the second stage in which data is written back to a memory cell.

However, in the techniques of Patent Documents 1-4, when a portion of signals of a plurality of bits read from the memory cell array are selected based on a column address, the selection and the error checking and correcting, etc. are performed after the column address is settled. Therefore, it is difficult to reduce the CAS access time, and therefore, it is difficult to increase the memory access rate.

The technique described in Patent Document 5 has been made in view of the above problems to provide a memory device with an ECC function in which the CAS access time is reduced, whereby the data transfer efficiency can be easily increased. However, in order to achieve a write mask function, it is necessary to perform error correction, parity generation, and write back operation to a memory cell during the same cycle when write operation is performed. Therefore, it is disadvantageously difficult to reduce the CAS cycle time.

In the technique described in Patent Document 6, it is necessary to perform one random cycle operation of word line activation, sense amplifier amplification and column access, word line inactivation, and precharge operation during at least one clock. Therefore, it is difficult to increase the clock cycle and thereby increase the data bandwidth, and in addition, the power consumption increases. Also, a byte write function is not provided, and therefore, it is disadvantageously difficult to increase the efficiency of use of a bus, particularly in a memory device having a multibus width, such as embedded DRAM devices.

SUMMARY

The present disclosure describes implementations of an improvement in the configuration of the semiconductor memory device described in Patent Document 5, which provides a memory device with an ECC function in which a write mask can be provided, and the CAS access time is short and the CAS cycle time is reduced, whereby the data transfer efficiency can be easily increased.

A first example semiconductor memory device of the present disclosure includes a memory cell array from which a data signal or signals of a first bit number including a payload data signal and an error checking and correcting code data signal are simultaneously read, a sense amplifier configured to amplify the read data signal or signals, a sense amplifier data selector configured to select a data signal or signals of a second bit number which are a portion of the data signals amplified by the sense amplifier, an error checking and correcting unit configured to perform error checking and correcting based on at least a portion of the selected data signals of the second bit number, a first holding unit configured to hold an input data signal externally input to the semiconductor memory device, a second holding unit connected to the first holding unit via a first switch, and an error checking and correcting code data signal generator configured to generate the error checking and correcting code data signal based on a data signal held in the second holding unit.

With this configuration, a portion of data signals amplified by the sense amplifier is selected, whereby the size of a circuit for a subsequent process can be reduced. If the selection is performed based on, for example, a row address, the selection itself and a subsequent error checking and correcting operation, etc., can be performed without a column address being settled, whereby the CAS access time can be reduced, for example. Moreover, parity generation can be executed based on data of the second holding unit separated from input/output data.

A second example semiconductor memory device is the first example semiconductor memory device further including an amplifier configured to amplify the data signal or signals of the second bit number selected by the sense amplifier data selector, an amplified data signal selector configured to select a data signal or signals of a third bit number which are a portion of the amplified data signals of the second bit number, and a write data replacement unit configured to replace a portion of the write data signals of the second bit number with the data signal or signals of the third bit number output from the second holding unit and the error checking and correcting code data signal generator.

With this configuration, the ratio of the access bit number of the memory cell array to the bit number of error checking and correction and the ratio of the write bit number of the memory array to the bit number of parity generation can be easily increased, for example, whereby the error correction process time and the circuit area can be easily optimized, for example.

A third example semiconductor memory device is the second example semiconductor memory device further including a third holding unit configured to hold a data signal which is obtained before or after amplification by the amplifier.

With this configuration, read and write operation to the same row address etc. can be quickly performed on data held in the third holding unit without read operation from the memory cell array or amplification by the sense amplifier, etc being repeated.

A fourth example semiconductor memory device is the third example semiconductor memory device in which the third holding unit also serves as the amplifier.

With this configuration, the third holding unit also serves as the amplifier, whereby the layout area can be easily reduced.

A fifth example semiconductor memory device is the third example semiconductor memory device further including a second switch configured to cut off conduction between the third holding unit and the sense amplifier data selector.

With this configuration, the influence of the parasitic capacitance is reduced by causing the second switch to be in the non-conductive state, whereby the amplification operation of the amplifier can be more quickly performed, for example. Also, the accumulation and discharging of electric charge for the parasitic capacitance are reduced, whereby the power consumption can be reduced.

A sixth example semiconductor memory device is the fifth example semiconductor memory device in which the write data signal is held via the write data replacement unit into the third holding unit, and the data in the third holding unit is written via the write back buffer and the sense amplifier data selector to the memory cell array.

With this configuration, when a portion of stored data is rewritten, data held in the third holding unit is updated. Therefore, read and write operation to the same row address after rewrite operation as described above (e.g., read access and write access in various orders during page operation, etc.) can be performed appropriately and quickly. Moreover, all data in the third holding unit can be written to the memory cell array during cycles independent of the CAS cycles, and therefore, the CAS cycle time is easily reduced, and the power consumption is reduced.

A seventh example semiconductor memory device is the sixth example semiconductor memory device in which the first switch becomes conductive for a predetermined time period after a clock input following a write cycle.

With this configuration, the first holding unit can be used as a pipeline write data latch, and in a read/modify/write sequence with an ECC function, an error correction process and a parity generation process can be performed during different clock cycles in a pipeline manner, whereby the CAS cycle time can be reduced, for example.

An eighth example semiconductor memory device is the sixth example semiconductor memory device in which the write data replacement unit indicates permission for replacement during a predetermined time period in the second external write command input cycle and the following external write command input cycles or in an external precharge command input cycle, after data is held into the third holding unit.

With this configuration, data held in the third holding unit can be reliably updated with payload data and generated parity data in a pipeline manner. Therefore, read and write operation to the same row address after rewrite operation as described above (e.g., read access and write access in various orders during page operation, etc.) can be performed appropriately and quickly, whereby the CAS cycle time can be easily reduced.

A ninth example semiconductor memory device is the sixth example semiconductor memory device in which the write back buffer indicates permission for memory cell write operation during a predetermined time period in an external precharge command input cycle.

With this configuration, all data can be written to the memory cell array during cycles independent of the CAS cycles, and therefore, the CAS cycle time is easily reduced, and the power consumption is reduced.

A tenth example semiconductor memory device is the ninth example semiconductor memory device in which the memory cell write permission continues to be indicated for a plurality of clock cycles.

With this configuration, even when the time required to write the memory cell array relatively increases with the CAS cycle time, the CAS cycle time can be further reduced while a sufficient time required to write the memory cell array is ensured.

An eleventh example semiconductor memory device is the ninth example semiconductor memory device in which when the memory cell write permission is indicated, the second switch is conductive.

With this configuration, write back operation to the memory cell array is allowed in two systems, i.e., a system using the write buffer and a system in which data latch of the third holding unit is directly driven, simultaneously, whereby the write back operation can be more quickly performed.

A twelfth example semiconductor memory device is the fifth example semiconductor memory device in which by causing the write data replacement unit to be conductive, the write data signal or signals of the second bit number are written via the sense amplifier data selector to the memory cell array, and are held via the second switch into the third holding unit.

With this configuration, write back operation to the memory cell array and updating of data held in the third holding unit can be simultaneously performed using payload data and generated parity data in a pipeline manner. Therefore, read and write operation to the same row address after rewrite operation as described above (e.g., read access and write access in various orders during page operation, etc.) can be performed appropriately and quickly, whereby the CAS cycle time can be reduced. Also, the number of write buffers can be reduced to decrease the chip area while the random cycle operations are improved.

A thirteenth example semiconductor memory device is the second example semiconductor memory device further including a write unit configured to replace data in the first holding unit with data in the second holding unit.

With this configuration, when there is a request for access to data which has not yet been held in the third holding unit, data in the second holding unit can be read out.

A fourteenth example semiconductor memory device is the thirteenth example semiconductor memory device in which permission for replacement of the write unit is indicated only during an external read command input cycle and the same address access as that during an immediately previous write cycle.

With this configuration, when there is a request for access to data which has not yet been held in the third holding unit, data in the second holding unit can be read out. Therefore, even when write operation is performed in a pipeline manner, page write and read operations can be continuously executed in a non-contradictory manner, whereby the efficiency of the bus can be increased and thereby the data bandwidth can be improved.

A fifteenth example semiconductor memory device is the third example semiconductor memory device further including a replacement selector configured to cause the first holding unit to hold a portion of data signals corrected by the error checking and correcting unit and a portion of input data signals externally input to the semiconductor memory device.

A sixteenth example semiconductor memory device is the fifteenth semiconductor memory device in which the replacement selector is controlled based on a mask signal indicating selection of the portion of the corrected data signals and the portion of the input data signals, and a hold permission signal indicating permission to hold a selected data signal in the first holding unit.

With these configurations, the position of data to be replaced, whether or not replacement is to be performed, etc., can be easily controlled, whereby byte write operation, bit write operation, etc., can be performed.

A seventeenth example semiconductor memory device is the sixteenth example semiconductor memory device in which the hold permission signal indicates the hold permission after the corrected data signal is settled.

With this configuration, it is possible to reduce or prevent an increase in power consumption which is caused by useless inversion of held data before or after the corrected data signal is settled.

An eighteenth example semiconductor memory device is the sixteenth example semiconductor memory device in which when the first switch is conductive, the hold permission signal indicates prohibition on holding.

With this configuration, when input/output data is held in the second holding unit, it is possible to reduce or prevent racing which occurs when error-corrected data or a portion of the error-corrected data is overwritten with an external input data signal.

A nineteenth example semiconductor memory device is the sixteenth example semiconductor memory device in which when the write data replacement unit is conductive, the hold permission signal indicates prohibition on holding.

With this configuration, even when a data signal held in the second holding unit which is to be written to the third holding unit is transferred via the error checking and correcting unit back to the first holding unit, it is possible to reduce or prevent racing which occurs when a data signal held in the first holding unit is overwritten with that data signal.

A twentieth example semiconductor memory device includes a first holding unit configured to replace a portion of error-corrected data with external input data to hold input/output data, a second holding unit configured to hold a copy of the input/output data, an error checking and correcting code data signal generator, a third holding unit configured to amplify and hold data of a memory cell selected based on a row address signal, a rewrite unit configured to rewrite the third holding unit, and a write back unit configured to write back the memory cell.

With these configurations, the read CAS access time can be reduced, and by performing write operation in a pipeline manner, the CAS cycle time can be reduced, for example.

According to the present disclosure, the CAS cycle time can be reduced, whereby data transfer efficiency can be improved, for example.

DETAILED DESCRIPTION

Embodiments of the present disclosure will be described in detail hereinafter with reference to the accompanying drawings. Note that, in the embodiments described below, components having similar functions will be indicated by the same reference characters and will not be redundantly described.

First Embodiment

<Configuration of Semiconductor Memory Device>

Figure 1:
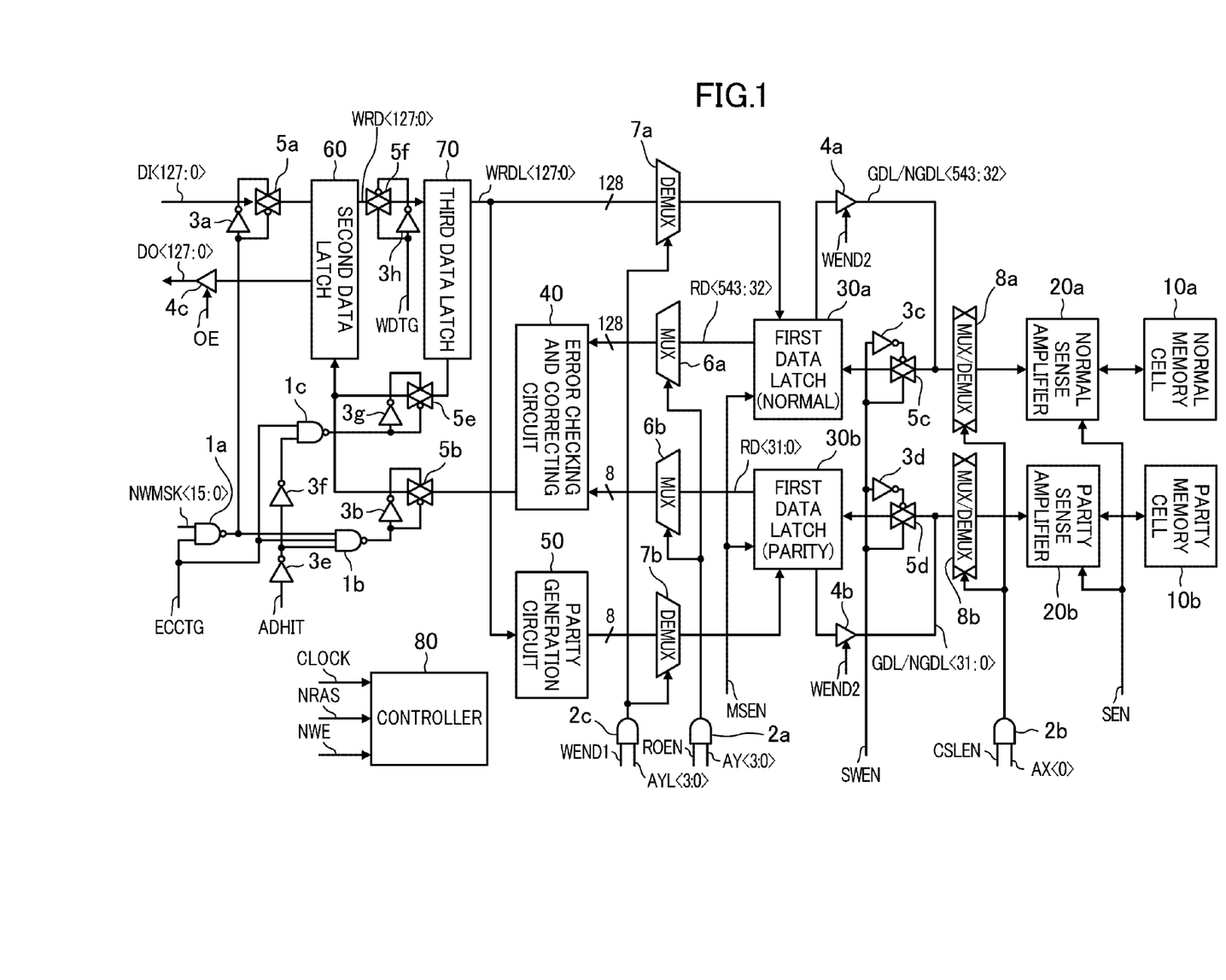
FIG. 1 is a block diagram showing a configuration of main components of a semiconductor memory device according to a first embodiment of the present disclosure.

FIG. 1 shows a configuration of main components of a semiconductor memory device (e.g., a DRAM device) according to a first embodiment of the present disclosure. In FIG. 1, the semiconductor memory device includes NAND elements 1a-1c, AND elements 2a-2c, inverter elements 3a-3h, tri-state elements 4a-4c, transfer gates 5a-5f, multiplexers 6a and 6b, demultiplexers 7a and 7b, multiplexers/demultiplexers 8a and 8b, memory cells 10a and 10b for normal data and parity data, respectively, sense amplifiers 20a and 20b for normal data and parity data, respectively, first data latches 30a and 30b for normal data and parity data, respectively, an error checking and correcting circuit 40, a parity generation circuit 50, a second data latch 60, a third data latch 70, and a controller 80.

Figure 2:
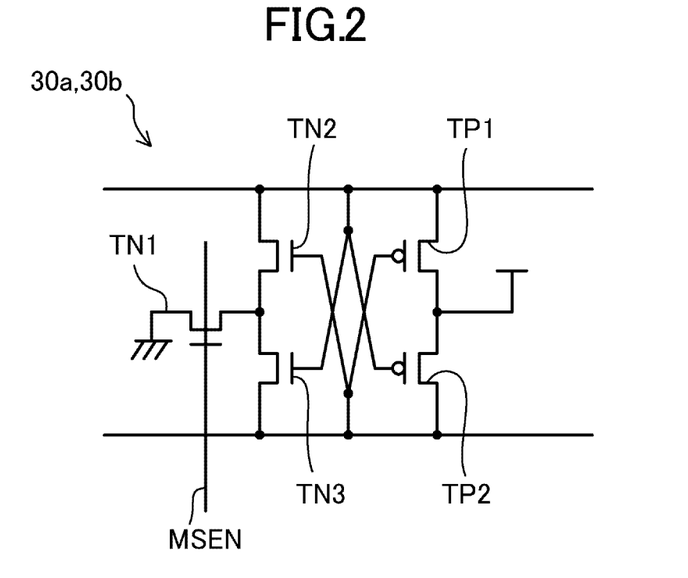
FIG. 2 is a circuit diagram showing a detailed example configuration of a first data latch of FIG. 1.

The first data latches 30a and 30b have an example specific configuration shown in FIG. 2, and also function as data amplifiers. In FIG. 2, the first data latches 30a and 30b each include N-type metal-oxide semiconductor (NMOS) transistors TN1-TN3 and P-type metal-oxide semiconductor (PMOS) transistors TP1 and TP2. This configuration provides a cross-coupling latch amplifier. When a first data latch control signal MSEN goes high, the latch amplifier amplifies the potential difference between a pair of input signal lines to output a signal having a high or low logic level, and holds the logic level. Thus, the first data latches 30a and 30b each function both as a data amplifier and a latch, whereby the layout area can be easily minimized.

The semiconductor memory device of FIG. 1 also includes global data lines GDL/NGDL <543:0>, first data latch nodes RD <543:0> which are outputs of the first data latches 30a and 30b, second data latch nodes WRD <127:0> which are outputs of the second data latch 60, third data latch nodes WRDL <127:0> which are outputs of the third data latch 70, an input data bus DI <127:0>, and an output data bus DO <127:0>.

The multiplexers/demultiplexers 8a and 8b, the memory cells 10a and 10b, and the sense amplifiers 20a and 20b are connected together via 1024 or 64 bit lines (cell access bit lines) so that 1024-bit normal data and 64-bit parity data are simultaneously read or written.

The reference character SEN indicates a sense amplifier control signal, the reference character CSLEN indicates a sense amplifier-global data line connection control signal, the reference character SWEN indicates a first data latch input control signal, the reference character MSEN indicates a first data latch control signal, the reference character ROEN indicates a first data latch output control signal, the reference character ECCTG indicates a second data latch/transfer control signal, the reference character WDTG indicates a third data latch/transfer control signal, the reference character ADHIT indicates a read address hit signal, the reference character WEND1 indicates a latch write control signal, the reference character WEND2 indicates a memory cell write control signal, the reference character OE indicates a read output control signal, the reference character AX <0> indicates a row predecode signal, the reference character AY <3:0> indicates column predecode signals, the reference character AYL <3:0> indicates latched column predecode signals, and the reference character NWMSK <15:0> indicates write mask signals.

In the semiconductor memory device, 128-bit data is input and output between the device and an external circuit via the input and output data buses DI <127:0> and DO <127:0>, and 8-bit parity data is added to the 128-bit data for the purpose of an ECC process. The semiconductor memory device also has a write mask function so that only a portion of the 128-bit input data is rewritten which is specified by the write mask signals NWMSK <15:0> in units of one byte, one bit, or a predetermined number of bits, etc.

The semiconductor memory device is also configured so that page operation in which each cycle is completed in two clocks or more can be performed.

Note that the second data latch 60 corresponds to the first holding unit. The third data latch 70 corresponds to the second holding unit. The first data latches 30a and 30b correspond to the third holding unit and the amplifier. The error checking and correcting circuit 40 corresponds to the error checking and correcting unit. The parity generation circuit 50 corresponds to the error correction code data signal generator. The multiplexers 6a and 6b correspond to the amplified data signal selector. The demultiplexers 7a and 7b correspond to the write data replacement unit. The multiplexers/demultiplexers 8a and 8b correspond to the sense amplifier data selector and the write back unit. The transfer gate 5f corresponds to the first switch. The transfer gates 5c and 5d correspond to the second switch. The transfer gates 5a and 5b correspond to the replacement selector. The transfer gate 5e and the inverter element 3g correspond to the write unit. The tri-state elements 4a and 4b correspond to the write back buffer and the rewrite unit.

<Operation of Semiconductor Memory Device>

Figure 3:
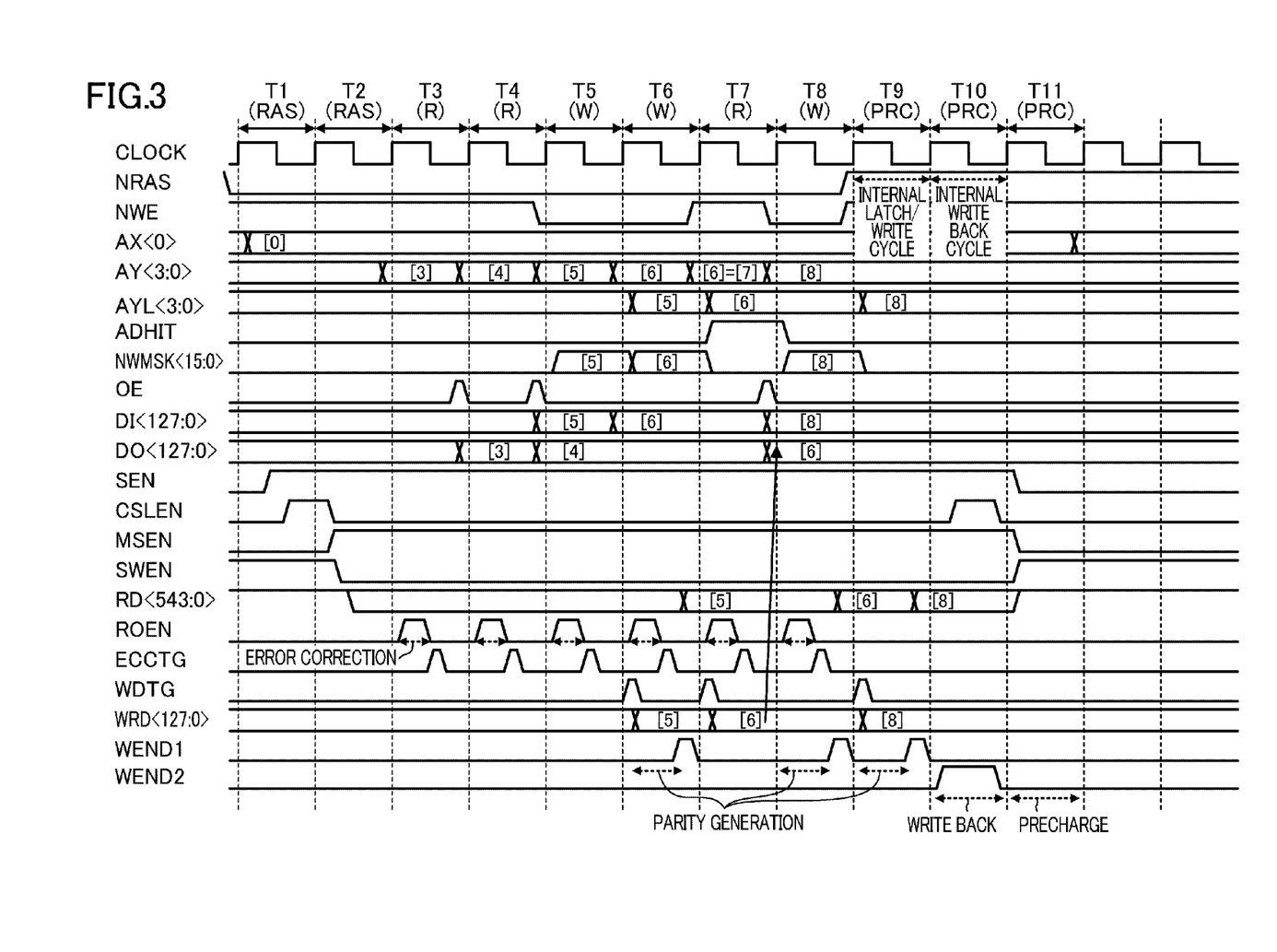
FIG. 3 is a timing diagram showing operation of the semiconductor memory device of FIG. 1.

Operation of the circuit thus configured will be described with reference to a timing diagram shown in FIG. 3. Although random operation can also be performed, only page operation will be described because the object and advantage of the present disclosure are to reduce the CAS cycle time during the page operation.

<RAS Access Operation>

RAS access operation is performed during time periods T1 and T2. Here, an example in which RAS access operation is completed in two CAS cycles is shown. The controller 80 detects that a row address strobe signal NRAS goes low (RAS command) at the rise of a clock signal CLOCK and thereby allows RAS operation during the time period T1 (RAS cycle), and during a time period T3 (third clock), detects the high level of a write enable signal NWE and the low level of the row address strobe signal NRAS and thereby allowing read operation (CAS cycle).

Initially, during the RAS cycles T1 and T2, if the RAS command is detected, a word line (not shown) is enabled (active level), so that memory cell data (1024-bit normal data and 64-bit parity data) is read from the memory cells 10a and 10b to bit lines, and following this, the sense amplifier control signal SEN is enabled, so that the sense amplifiers 20a and 20b begin to operate.

Thereafter, when the sense amplifier-global data line connection control signal CSLEN goes high, the multiplexers/demultiplexers 8a and 8b select (512+32) of the (1024+64) bit lines based on the row predecode signal AX<0> which has been settled since the detection of the RAS command, and connect the (512+32) bit lines to the global data lines GDL/NGDL <543:0>. At this time, the first data latch input control signal SWEN goes high, so that the transfer gates 5c and 5d become conductive. As a result, data on the selected bit lines is input via the global data lines GDL/NGDL <543:0> to the first data latches 30a and 30b. Note that, at this time, the interconnect capacitance of the global data lines GDL/NGDL <543:0> is typically large, and therefore, the potentials of signals input to the global data lines GDL/NGDL <543:0> and the first data latches 30a and 30b are only slightly changed.

Next, when the first data latch control signal MSEN goes high, the data in the first data latches 30a and 30b begins to be amplified. Moreover, the first data latch input control signal SWEN goes low, so that the large parasitic capacitances of the global data lines GDL/NGDL <543:0> are removed. As a result, the potentials of the first data latch nodes RD <543:0> are quickly amplified, whereby the data is settled. Here, if the first data latch nodes RD <543:0> and the global data lines GDL/NGDL <543:0> are separated as described above, the global data lines GDL/NGDL <543:0> are not unnecessarily amplified to the full amplitude, and therefore, the power consumption can be easily reduced. While, in this example, one RAS cycle is completed in two CAS cycles, the number of cycles in which one RAS cycle is completed can be arbitrarily selected. For example, when the size of the memory cell array is large and therefore it takes a time to settle read data, the number of clocks in RAS cycles can be increased without changing the number of clocks in CAS cycles, and the CAS cycle time can be set without depending on the rate of reading from a cell which significantly depends on the memory array size.

<Page Write Operation>

Example page write operation is performed during time periods T5, T6, and T8. The controller 80 detects the low level of the row address strobe signal NRAS (RAS command) and the low level of the write enable signal NWE at the rise of the clock signal CLOCK, and allows page write operation. Here, if the error correction function and the byte write function are provided, write operation requires a read/modify/write sequence. Therefore, similar to read operation, memory cell data needs to be read, amplified, and held at the first data latch nodes RD <543:0> during the RAS cycles T1 and T2.

During the CAS cycle T5, initially, error correction operation is performed. Specifically, the multiplexers 6a and 6b, when the first data latch output control signal ROEN goes high, select one fourth ((128+8) bits) of the data at the first data latch nodes RD <543:0> based on the column predecode signals AY <3:0>, and input the data as normal read data and parity read data to the error checking and correcting circuit 40. The error checking and correcting circuit 40 outputs 128-bit error-corrected data.

Thereafter, when the second data latch/transfer control signal ECCTG goes high, write data which is obtained by replacing only a byte position corresponding high-level bits of the write mask signals NWMSK <15:0> of the error-corrected data output from the error checking and correcting circuit 40 is replaced with data on the input data bus DI <127:0>, is held at the second data latch nodes WRD <127:0> of the second data latch 60. Here, data of a path from the input data bus DI <127:0> and data of a path from the error checking and correcting circuit 40 are input to the second data latch nodes WRD <127:0>. The transfer gates 5a and 5b at the corresponding bit position are controlled based on the write mask signals NWMSK <15:0>, and do not simultaneously become conductive. Therefore, it is possible to avoid a situation that signals input to the second data latch 60 collide with each other to cause the level of the second data latch nodes WRD <127:0> to be unstable.

Next, during the CAS cycle T6, initially, the third data latch/transfer control signal WDTG goes high, so that data at the second data latch nodes WRD <127:0> is copied to the third data latch nodes WRDL <127:0>. After the third data latch nodes WRDL <127:0> are settled, the third data latch/transfer control signal WDTG goes low. The data at the third data latch nodes WRDL <127:0> is input to the demultiplexer 7a, and in addition, to the parity generation circuit 50, and generated parity data is input to the demultiplexer 7b.

Because the CAS cycle T6 is a write cycle, when the latch write control signal WEND1 goes high after the generated parity data is settled, the demultiplexers 7a and 7b are activated to transfer the input data and the parity data to (128+8) of the (512+32) first data latch nodes RD <543:0> that are selected based on the latched column predecode signals AYL <3:0>. The latched column predecode signals AYL <3:0> indicates an address at which the column predecode signals AY <3:0> accessed during the CAS cycle T5 are latched.

At the same time, error correction operation is performed based on the column predecode signals AY <3:0> accessed during the cycle T6, and write data which is the error-corrected data only whose byte position is replaced with the data on the input data bus DI <127:0> is latched at the second data latch nodes WRD <127:0>. Here, the second data latch/transfer control signal ECCTG goes high after the third data latch/transfer control signal WDTG goes low, and the data written to the second data latch nodes WRD <127:0> during the cycle T5 is overwritten with the error-corrected data obtained during the cycle T6 or the data on the input data bus DI <127:0> after the data is copied to the third data latch 70. Also, the latch write control signal WEND1 goes high after the second data latch/transfer control signal ECCTG goes low, and the error-corrected data held at the second data latch 60 during the cycle T6 is not overwritten with data which is newly written to the first data latch nodes RD <543:0>. During a cycle T7, when the error-corrected data held at the second data latch 60 during the cycle T6 is copied to the third data latch 70 and is subjected to parity generation. Because the cycle T7 is a read cycle, the demultiplexers 7a and 7b are not activated, and the write data input to the demultiplexers 7a and 7b is held at the demultiplexers 7a and 7b.

During the cycle T8, error correction operation is performed based on the accessed column predecode signals AY <3:0>, write data which is the error-corrected data only whose byte position is replaced with the data on the input data bus DI <127:0> is latched at the second data latch nodes WRD <127:0>. At the same time, the demultiplexers 7a and 7b are activated so that the write data generated during the cycle T7 is latched at the first data latch nodes RD <543:0>.

During a cycle T9, the controller 80 detects that the row address strobe signal NRAS is high (precharge command) at the rise of the clock signal CLOCK, that the current cycle is the first precharge cycle, and that there have been one or more times of CAS write access, and executes an internal latch/write cycle. During this cycle, the error-corrected data held at the second data latch 60 during the cycle T8 is copied to the third data latch 70 and is subjected to parity generation during the cycle T9, and after the generated parity data is settled, the latch write control signal WEND1 goes high, so that the demultiplexers 7a and 7b are activated so that the input data and the parity data are latched at the first data latch nodes RD <543:0>. While, in this embodiment, it is assumed that error correction operation is not performed, error correction operation may be performed in order to simplify control (obtained error-corrected data is not used).

During a cycle T10, the controller 80 detects that the row address strobe signal NRAS is high (precharge command) at the rise of the clock signal CLOCK, that the current cycle is the second precharge cycle, and that there have been one or more times of CAS write access, and executes an internal write back cycle. During this cycle, all data at the (512+32) first data latch nodes RD <543:0> input to the tri-state elements 4a and 4b are transferred by activation of the memory cell write control signal WEND2 to (128+8) of the (512+32) global data lines GDL/NGDL <543:0> which are selected based on the column predecode signals AY <3:0>. On the other hand, when the sense amplifier-global data line connection control signal CSLEN goes high, the multiplexers/demultiplexers 8a and 8b connect the (512+32) global data lines GDL/NGDL <543:0> to (512+32) of the (1024+64) bit lines which are selected based on the row predecode signal AX <0>. At this time, the sense amplifier control signal SEN is enabled so that the sense amplifiers 20a and 20b are in the operating state. If the tri-state elements 4a and 4b are set to have higher drive capability than that of the sense amplifiers 20a and 20b, then when both of the tri-state elements 4a and 4b and the sense amplifiers 20a and 20b have different data values, data on the bit lines is replaced with data output from the tri-state elements 4a and 4b, and the resulting data is written to the memory cells 10a and 10b.

During a cycle T11, the controller 80 detects that the row address strobe signal NRAS is high (precharge command) at the rise of the clock signal CLOCK, that the current cycle is the third precharge cycle, and that there have been one or more times of CAS write access, and executes a precharge cycle. During this cycle, memory cell data is settled and held by inactivation of a word line (not shown), and moreover, the sense amplifier control signal SEN and the first data latch control signal MSEN go low and the first data latch input control signal SWEN goes high, so that the global data lines GDL/NGDL <543:0> and the bit lines are precharged by a precharge circuit (not shown).

With the above configuration, the number of bits is reduced by a factor of two by the selection based on the row predecode signal AX <0>, whereby the circuit sizes of the first data latches 30a and 30b can be reduced. In addition, even when data read from the memory cells 10a and 10b is held in the first data latches 30a and 30b before data on the input data bus DI <127:0> is written to the memory cells 10a and 10b, data in the sense amplifiers 20a and 20b is not transferred to the first data latches 30a and 30b, and immediately after the column predecode signals AY <3:0> are settled, the data latched in the first data latches 30a and 30b is transferred to the succeeding error checking and correcting circuit 40. Therefore, when an ECC process is performed, an increase in CAS latency and CAS cycle time can be reduced, particularly during page operation.

It has been described above that read/modify/write operation is required in order to allow a write mask. Conventionally, error correction, parity generation, and write back operation to the memory cells 10a and 10b need to be performed during a single CAS write cycle. In the above embodiment, each operation can be divided into three stages which are subjected to a pipeline process, whereby the CAS cycle time can be reduced.

In the embodiment of the present disclosure, it has been assumed that one write back cycle is made of one CAS cycle, one write back cycle may be made of a plurality of clocks. As described above, the number of clocks during one RAS cycle can be arbitrarily set. Therefore, the CAS clock cycle can be set without depending on the read rates of the memory cells 10a and 10b and the write back rates of the memory cells 10a and 10b which significantly depend on the memory array size. The CAS clock cycle can be reduced to be substantially equal to the error correction time or a period of time required for parity generation, and therefore, a considerably high-rate CAS access can be achieved.

It is not necessary to transfer data from the sense amplifiers 20a and 20b to the first data latches 30a and 30b or to write data from the first data latches 30a and 30b via the sense amplifiers 20a and 20b back to the memory cells 10a and 10b every time page write mask CAS access is performed. Therefore, the global data lines GDL/NGDL <543:0> having large parasitic capacitance do not need to be driven, resulting in a significant reduction in power consumption.

This semiconductor memory device particularly has a configuration suited to embedded DRAM having a large capacity and a large data bus width. A high efficiency of use of the bus is achieved by the byte write function and a high bandwidth is also achieved by the high-rate page cycle operation. In addition, ultra-low power consumption operation can be performed. Both the data bandwidth and the power performance are more excellent than those of one-clock embedded DRAM devices.

<Page Read Operation> a. Normal Read Operation

During the CAS cycles T3 and T4, example page read operation is illustrated, and the controller 80 detects that the row address strobe signal NRAS is low (RAS command) at the rise of the clock signal CLOCK and that the write enable signal NWE is high, and allows page read operation. The multiplexers 6a and 6b, when the first data latch output control signal ROEN goes high, select one fourth ((128+8) bits) of (512+32)-bit data at the first data latch nodes RD <543:0> output from the first data latches 30a and 30b, and input the selected data as normal read data and parity read data to the error checking and correcting circuit 40, based on the column predecode signals AY <3:0> which have been settled since the detection of the CAS cycle. The error checking and correcting circuit 40 outputs 128-bit error-corrected data.

Thereafter, when the second data latch/transfer control signal ECCTG goes high at the time that error correction is completed, the write mask signals NWMSK <15:0> are controlled to the low level during a read cycle, and therefore, all error-corrected data is latched in the second data latch 60, and is output to the output data bus DO <127:0> by activation of the read output control signal OE.

When it is detected that the row address strobe signal NRAS is high (precharge command), the precharge sequence described above in the page write operation is executed, so that the global data lines GDL/NGDL <543:0> and the bit lines are precharged by a precharge circuit (not shown). If there is not a write cycle during a page cycle, three clock cycles are required as an external precharge command cycle after page write operation. By contrast, only one clock cycle is required, whereby the random access rate can be improved. While, in this embodiment, an example in which the CAS read latency is zero has been described, the latency can, of course, be changed, depending on the purpose.

In page read operation, data in the sense amplifiers 20a and 20b is not newly transferred to the first data latches 30a and 30b, and immediately after the column predecode signals AY <3:0> are settled, data latched in the first data latches 30a and 30b is transferred to the succeeding error checking and correcting circuit 40. Therefore, when an ECC process is performed, an increase in CAS latency and CAS cycle time can be reduced, particularly during page operation. It is not necessary to drive the global data lines GDL/NGDL <543:0> having large parasitic capacitance (load) to transfer data from the sense amplifiers 20a and 20b to the first data latches 30a and 30b every time page read CAS access is performed, and therefore, the power consumption can be easily reduced.

b. Write Latch Data Hit/Read Operation

During the CAS cycle T7, example write latch data hit/read operation is illustrated. In this operation mode, it is detected that the row address strobe signal NRAS is low (RAS command) at the rise of the clock signal CLOCK and that the write enable signal NWE is high, read operation is started, and error correction operation is performed. At the same time, it is detected that an address accessed during the immediately previous write cycle (in this example, the cycle T6) is the same as a read access address during the cycle T7, and therefore, the read address hit signal ADHIT is high. When the second data latch/transfer control signal ECCTG goes high at the time when error correction is completed, data held in the third data latch 70 is latched in the second data latch 60 instead of error-corrected data because the read address hit signal ADHIT is high, and is output to the output data bus DO <127:0> by activation of the read output control signal OE. Precharge operation is similar to that which is performed during the above normal read operation.

With this configuration, even when there is a read request for external write data which has not yet been latched in the first data latches 30a and 30b (but is held in the third data latch 70), data in the third data latch 70 is bypassed and output, whereby non-contradictory read data can be output. Moreover, as described above, while a considerably high-rate CAS access is achieved, page access in which write operation and read operation coexist in each CAS cycle is achieved. Therefore, highly efficient bus access can be achieved using a considerably high bandwidth, particularly in an embedded DRAM device having a large capacity and a large data bus width.

Second Embodiment

Figure 4:
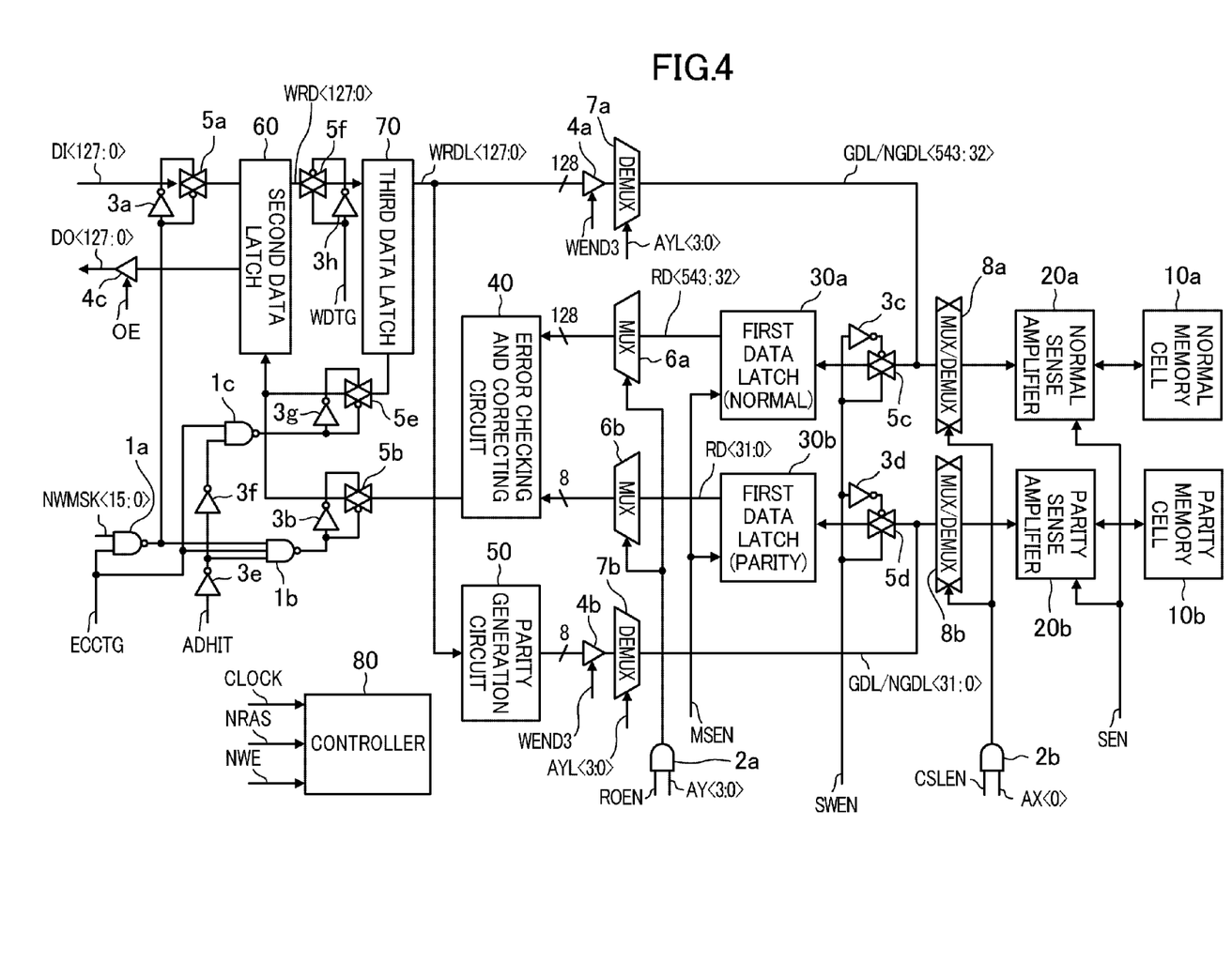
FIG. 4 is a block diagram showing a configuration of main components of a semiconductor memory device according to a second embodiment of the present disclosure.

FIG. 4 shows a configuration of main components of a semiconductor memory device according to a second embodiment of the present disclosure. The semiconductor memory device of FIG. 4 is different from the semiconductor memory device of the first embodiment in that a latch/memory cell write control signal WEND3 is used to simultaneously write a signal at the third data latch nodes WRDL <127:0> to the first data latches 30a and 30b for normal data and parity data and the memory cells 10a and 10b for normal data and parity data.

Figure 5:
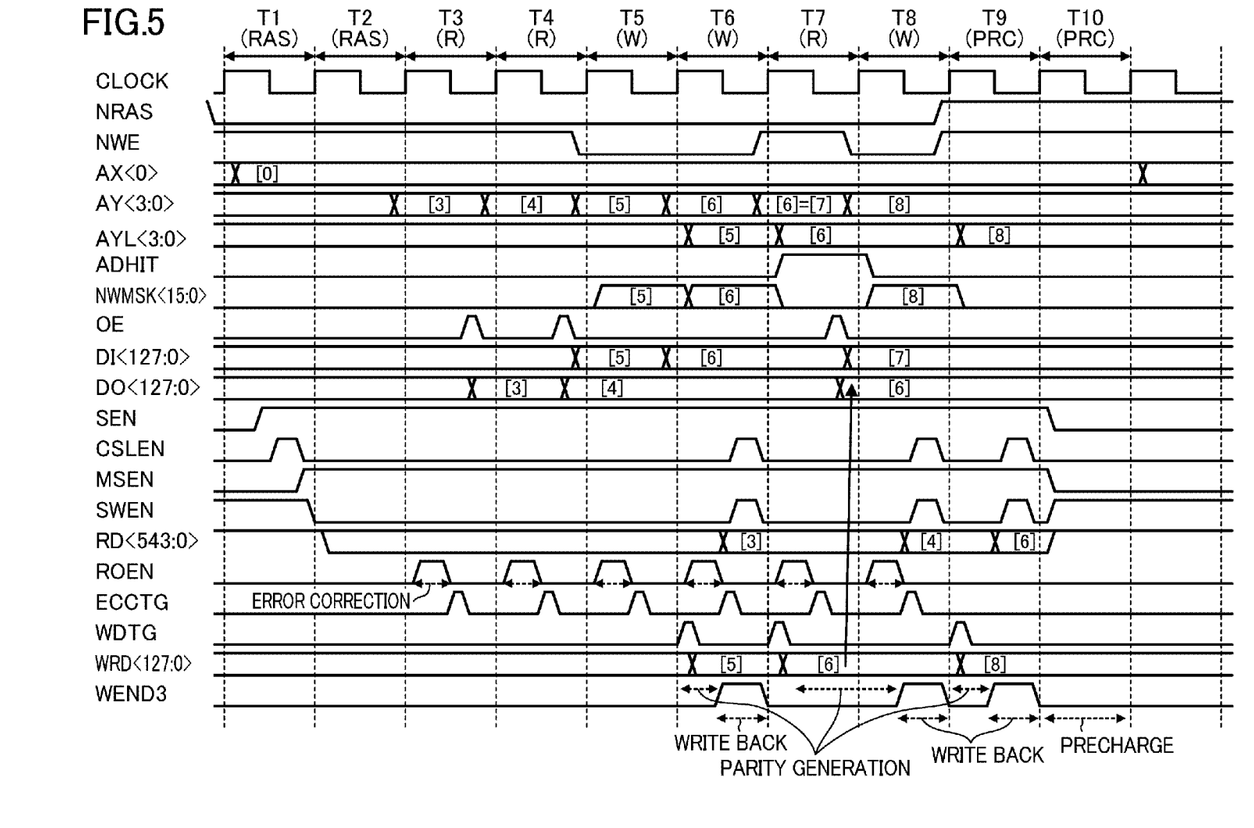
FIG. 5 is a timing diagram showing operation of the semiconductor memory device of FIG. 4.

Operation of the circuit thus configured will be described with reference to a timing diagram shown in FIG. 5. Note that normal read operation and write latch data hit/read operation are the same as those of the first embodiment and their advantages are also similar to those of the first embodiment, and therefore, only page write operation will be described.

<Page Write Operation>

During time periods T5, T6, and T8, example page write operation is performed, and the controller 80 detects that the row address strobe signal NRAS is low (RAS command) at the rise of the clock signal CLOCK and that the write enable signal NWE is low, and allows page write operation. Here, if an error correction function and a byte write function are provided, write operation requires a read/modify/write sequence. Therefore, similar to read operation, memory cell data needs to be read, amplified, and held at the first data latch nodes RD <543:0> during the RAS cycles T1 and T2.

During the CAS cycle T5, initially, error correction operation is performed. Specifically, the multiplexers 6a and 6b, when the first data latch output control signal ROEN goes high, select one fourth ((128+8) bits) of the data at the first data latch nodes RD <543:0> based on the column predecode signals AY <3:0>, and input the data as normal read data and parity read data to the error checking and correcting circuit 40. The error checking and correcting circuit 40 outputs 128-bit error-corrected data.

Thereafter, when the second data latch/transfer control signal ECCTG goes high, write data which is obtained by replacing only a byte position corresponding high-level bits of the write mask signals NWMSK <15:0> of the error-corrected data output from the error checking and correcting circuit 40 is replaced with data on the input data bus DI <127:0>, is held at the second data latch nodes WRD <127:0> of the second data latch 60.

Operation during the first cycle in which a write command is input is similar to that of the first embodiment. Operation during the following CAS cycle T6 and thereafter is different from that of the first embodiment. Initially, the third data latch/transfer control signal WDTG goes high, so that data at the second data latch nodes WRD <127:0> is copied to the third data latch nodes WRDL <127:0>, and after the third data latch nodes WRDL <127:0> are settled, the third data latch/transfer control signal WDTG goes low. The data at the third data latch nodes WRDL <127:0> is input to the tri-state element 4a, and in addition, to the parity generation circuit 50. The generated parity data is input to the tri-state element 4b. Because the CAS cycle T6 is a write cycle, when the latch/memory cell write control signal WEND3 goes high after the generated parity data is settled, (128+8) bits of the original data and the parity data are input from the tri-state elements 4a and 4b to the demultiplexers 7a and 7b. The demultiplexers 7a and 7b transfer the input data and the parity data to (128+8) of the (512+32) global data lines GDL/NGDL <543:0> which are selected based on the latched column predecode signals AYL <3:0>.

On the other hand, when the sense amplifier-global data line connection control signal CSLEN goes high, the multiplexers/demultiplexers 8a and 8b connect the (512+32) global data lines GDL/NGDL <543:0> to (512+32) of (1024+64) bit lines which are selected based on the row predecode signal AX <0>. At this time, the sense amplifier control signal SEN is enabled so that the sense amplifiers 20a and 20b are in the operating state. If the tri-state elements 4a and 4b are set to have higher drive capability than that of the sense amplifiers 20a and 20b, then when both of the tri-state elements 4a and 4b and the sense amplifiers 20a and 20b have different data values, data on the bit lines is replaced with data output from the tri-state elements 4a and 4b, and the resulting data is written to the memory cells 10a and 10b. Here, data at a byte position corresponding to low-level bits of the write mask signals NWMSK <15:0> of (128+8)-bit data output from the tri-state elements 4a and 4b, is data originally read from the memory cells 10a and 10b during the RAS cycle. Therefore, actually, only data at a byte position corresponding to high-level bits of the write mask signals NWMSK <15:0> is rewritten with data on the input data bus DI <127:0>.

When the first data latch input control signal SWEN goes high, (128+8) of the global data lines GDL/NGDL <543:0> which are selected based on the column predecode signals AY <3:0> are also connected via the transfer gates 5c and 5d to the first data latches 30a and 30b, and data at the first data latch nodes RD <543:0> is also updated.

At the same time, error correction operation is performed based on the column predecode signals AY <3:0> accessed during the cycle T6, and write data which is the error-corrected data only whose byte position is replaced with the data on the input data bus DI <127:0> is latched at the second data latch nodes WRD <127:0>. Here, the second data latch/transfer control signal ECCTG goes high after the third data latch/transfer control signal WDTG goes low, and the data written to the second data latch nodes WRD <127:0> during the cycle T5 is overwritten with the error-corrected data obtained during the cycle T6 or the data on the input data bus DI <127:0> after the data is copied to the third data latch 70. Also, the latch/memory cell write control signal WEND3 goes high after the second data latch/transfer control signal ECCTG goes low, and the error-corrected data held at the second data latch 60 during the cycle T6 is not overwritten with data which is newly written to the first data latch nodes RD <543:0>.

During the cycle T7, when the error-corrected data held at the second data latch 60 during the cycle T6 is copied to the third data latch 70 and is subjected to parity generation. Because the cycle T7 is a read cycle, the latch/memory cell write control signal WEND3 is low, and (128+8) bits of the original data and the parity data input to the tri-state elements 4a and 4b are held at the tri-state elements 4a and 4b. In the following CAS write cycle T8, operation similar to that during the write cycle T6 is performed.

During the cycle T9, the controller 80 detects that the row address strobe signal NRAS is high (precharge command) at the rise of the clock signal CLOCK, that the current cycle is the first precharge cycle, and that there have been one or more times of CAS write access, and executes an internal latch/memory cell write back cycle. Basically similar to the CAS write cycles T6 and T8, the third data latch/transfer control signal WDTG goes high, so that data at the second data latch nodes WRD <127:0> is copied to the third data latch nodes WRDL <127:0>, and after the third data latch nodes WRDL <127:0> are settled, the third data latch/transfer control signal WDTG goes low. The data at the third data latch nodes WRDL <127:0> is input to the tri-state element 4a, and in addition, to the parity generation circuit 50, and the generated parity data is input to the tri-state element 4b. During the CAS cycle T9, a write command is internally generated, and therefore, when the latch/memory cell write control signal WEND3 goes high after the generated parity data is settled, (128+8) bits of the original data and the parity data are input from the tri-state elements 4a and 4b to the demultiplexers 7a and 7b. The demultiplexers 7a and 7b transfer the input data and the parity data to (128+8) of the (512+32) global data lines GDL/NGDL <543:0> which are selected based on the latched column predecode signals AYL <3:0>.

On the other hand, when the sense amplifier-global data line connection control signal CSLEN goes high, the multiplexers/demultiplexers 8a and 8b connect the (512+32) global data lines GDL/NGDL <543:0> to (512+32) of the (1024+64) bit lines which are selected based on the row predecode signal AX <0>. At this time, the sense amplifier control signal SEN is enabled so that the sense amplifiers 20a and 20b are in the operating state. If the tri-state elements 4a and 4b are set to have higher drive capability than that of the sense amplifiers 20a and 20b, then when both of the tri-state elements 4a and 4b and the sense amplifiers 20a and 20b have different data values, data on the bit lines is replaced with data output from the tri-state elements 4a and 4b, and the resulting data is written to the memory cells 10a and 10b. Here, data at a byte position corresponding to low-level bits of the write mask signals NWMSK <15:0> of (128+8)-bit data output from the tri-state elements 4a and 4b, is data originally read from the memory cells 10a and 10b during the RAS cycle.

Therefore, actually, only data at a byte position corresponding to high-level bits of the write mask signals NWMSK <15:0> is rewritten with data on the input data bus DI <127:0>.

When the first data latch input control signal SWEN goes high, (128+8) of the global data lines GDL/NGDL <543:0> which are selected based on the column predecode signals AY <3:0> are connected via the transfer gates 5c and 5d to the first data latches 30a and 30b, and data at the first data latch nodes RD <543:0> is also updated. Note that it is not particularly necessary to update the first data latches 30a and 30b, because data is erased by precharging during the next cycle. In this embodiment, the same control as those in the other write operations is performed, thereby simplifying the control circuit. While, in this embodiment, it has been assumed that error correction operation is not performed, error correction operation may be executed in order to simplify the control.

During a cycle T10, the controller 80 detects that the row address strobe signal NRAS is high (precharge command) at the rise of the clock signal CLOCK, that the current cycle is the second precharge cycle, and that there have been one or more times of CAS write access, and executes a precharge cycle. In this cycle, memory cell data is settled and held by inactivation of a word line (not shown), and moreover, the sense amplifier control signal SEN and the first data latch control signal MSEN go low and the first data latch input control signal SWEN goes high, so that the global data lines GDL/NGDL <543:0> and the bit lines are precharged by a precharge circuit (not shown).

Conventionally, error correction, parity generation, and write back operation to the memory cells 10a and 10b need to be performed during a single CAS write cycle. With the above configuration, each operation can be divided into two stages (i.e., error correction and parity generation/write back) which are subjected to a pipeline process, whereby the CAS cycle time can be reduced while allowing a write mask. Compared to the first embodiment, a cycle dedicated to write back operation to the memory cells 10a and 10b does not need to be additionally provided, and therefore, precharge cycles can be reduced to improve random cycle operations. Moreover, the number of the tri-state elements 4a and 4b can be set to be smaller than the number of the first data latches 30a and 30b (in this embodiment, ¼), whereby the area can be reduced.

Note that the present disclosure is not limited to the above embodiments, and various changes and modifications can, of course, be made without departing the scope and spirit of the present disclosure.

For example, the number of bits in an ECC process is not limited to the above example in which 8-bit parity data is used for normal 128-bit data, and may be any other number of bits. The number of bits of an input address to the multiplexers/demultiplexers 8a and 8b is not limited to one (selection of ½), and may be plural. The number of the column predecode signals AY <3:0> for the multiplexers 6a and 6b and the demultiplexers 7a and 7b is not limited to four (selection of ¼), and may be various other numbers. Only selection by the multiplexers/demultiplexers 8a and 8b may be performed. Note that as the number of bits of a row address used to control the multiplexers/demultiplexers 8a and 8b increases, the circuit sizes of the first data latches 30a and 30b can be reduced, and the range within which access can be made by changing the column address during CAS cycles is reduced. Therefore, the settings may be made based on a required circuit size or transfer efficiency.

The data amplification function and the data latch function of the first data latches 30a and 30b may be separated and implemented in separate circuits.

The name of the data amplifier is only provided as an example to identify the component. The data amplifier may be, for example, a buffer having an amplification gain of one.

The latch function may not be necessarily provided. Specifically, for example, in the first embodiment (FIG. 1), when only the multiplexers/demultiplexers 8a and 8b are used to perform selection of ⅛ based on a 3-bit row address, thereby obtaining 128-bit data, all the data (or error-corrected data) is held in the second data latch 60, and therefore, even if the latch function (of the first data latches 30a and 30b) is not provided, write operation can be performed on a byte-by-byte basis, for example.

For example, the RAS cycle may be made of a plurality of clock cycles, or precharge operation may be performed during independent clock cycles.

A plurality of the above semiconductor memory devices may be provided on a single memory macro, and data may be input and output in parallel. Such a configuration is suitable for an embedded DRAM device including a plurality of data buses.

The semiconductor memory device of the present disclosure has advantages of, for example, easily reducing the CAS cycle time and thereby increasing the data transfer efficiency, and is useful as, for example, a semiconductor memory device including an error checking and correcting circuit.

What is claimed is:

1. A semiconductor memory device comprising:
    a memory cell array from which a data signal or signals of a first bit number including a payload data signal and an error checking and correcting code data signal are simultaneously read;
    a sense amplifier configured to amplify the read data signal or signals;
    a sense amplifier data selector configured to select a data signal or signals of a second bit number which are a portion of the data signals amplified by the sense amplifier;
    an error checking and correcting unit configured to perform error checking and correcting based on at least a portion of the selected data signals of the second bit number;
    a first holding unit configured to hold an input data signal externally input to the semiconductor memory device;
    a second holding unit connected to the first holding unit via a first switch;
    an amplifier configured to amplify the data signal or signals of the second bit number selected by the sense amplifier data selector;
    a third holding unit configured to hold a data signal which is obtained before or after amplification by the amplifier; and
    an error checking and correcting code data signal generator configured to generate the error checking and correcting code data signal based on a data signal held in the second holding unit.

2. The semiconductor memory device of claim 1, further comprising:
    an amplified data signal selector configured to select a data signal or signals of a third bit number which are a portion of the amplified data signals of the second bit number; and
    a write data replacement unit configured to replace a portion of the write data signals of the second bit number with the data signal or signals of the third bit number output from the second holding unit and the error checking and correcting code data signal generator.

3. The semiconductor memory device of claim 1, wherein the third holding unit also serves as the amplifier.

4. The semiconductor memory device of claim 1, further comprising:
    a second switch configured to cut off conduction between the third holding unit and the sense amplifier data selector.

5. The semiconductor memory device of claim 4, wherein the write data signal is held via the write data replacement unit into the third holding unit, and the data in the third holding unit is written via the write back buffer and the sense amplifier data selector to the memory cell array.

6. The semiconductor memory device of claim 5, wherein the first switch becomes conductive for a predetermined time period after a clock input following a write cycle.

7. The semiconductor memory device of claim 5, wherein the write data replacement unit indicates permission for replacement during a predetermined time period in the second external write command input cycle and the following external write command input cycles or in an external precharge command input cycle, after data is held into the third holding unit.

8. The semiconductor memory device of claim 5, wherein the write back buffer indicates permission for memory cell write operation during a predetermined time period in an external precharge command input cycle.

9. The semiconductor memory device of claim 8, wherein the memory cell write permission continues to be indicated for a plurality of clock cycles.

10. The semiconductor memory device of claim 8, wherein when the memory cell write permission is indicated, the second switch is conductive.

11. The semiconductor memory device of claim 1, further comprising:
    a replacement selector configured to cause the first holding unit to hold a portion of data signals corrected by the error checking and correcting unit and a portion of input data signals externally input to the semiconductor memory device.

12. The semiconductor memory device of claim 11, wherein the replacement selector is controlled based on a mask signal indicating selection of the portion of the corrected data signals and the portion of the input data signals, and a hold permission signal indicating permission to hold a selected data signal in the first holding unit.

13. The semiconductor memory device of claim 12, wherein the hold permission signal indicates the hold permission after the corrected data signal is settled.

14. The semiconductor memory device of claim 12, wherein when the first switch is conductive, the hold permission signal indicates prohibition on holding.

15. The semiconductor memory device of claim 12, wherein when the write data replacement unit is conductive, the hold permission signal indicates prohibition on holding.

16. The semiconductor memory device of claim 2, further comprising:
    a write unit configured to replace data in the first holding unit with data in the second holding unit.

17. The semiconductor memory device of claim 16, wherein permission for replacement of the write unit is indicated only during an external read command input cycle and the same address access as that during an immediately previous write cycle.

18. The semiconductor memory device of claim 4, wherein by causing the write data replacement unit to be conductive, the write data signal or signals of the second bit number are written via the sense amplifier data selector to the memory cell array, and are held via the second switch into the third holding unit.

* * * * *